United States Patent
Lin et al.

(10) Patent No.: US 10,157,737 B2
(45) Date of Patent: Dec. 18, 2018

(54) SEMICONDUCTOR DEVICES COMPRISING 2D-MATERIALS AND METHODS OF MANUFACTURE THEREOF

(71) Applicants: Taiwan Semiconductor Manufacturing Company, Ltd., Hsin-Chu (TW); National Taiwan University, Taipei (TW)

(72) Inventors: Meng-Yu Lin, New Taipei (TW); Shih-Yen Lin, Tainan (TW); Si-Chen Lee, Taipei (TW); Samuel C. Pan, Hsin-Chu (TW)

(73) Assignees: Taiwan Semiconductor Manufacturing Company, Ltd., Hsinchu (TW); National Taiwan University, Taipei (TW)

( * ) Notice: Subject to any disclaimer, the term of this patent is extended or adjusted under 35 U.S.C. 154(b) by 0 days.

(21) Appl. No.: 15/807,178

(22) Filed: Nov. 8, 2017

(65) Prior Publication Data
US 2018/0068851 A1  Mar. 8, 2018

Related U.S. Application Data

(62) Division of application No. 14/621,635, filed on Feb. 13, 2015, now Pat. No. 9,859,115.

(51) Int. Cl.
*H01L 29/12* (2006.01)
*H01L 21/02* (2006.01)
(Continued)

(52) U.S. Cl.
CPC .... *H01L 21/02568* (2013.01); *H01L 21/0259* (2013.01); *H01L 21/0262* (2013.01);
(Continued)

(58) Field of Classification Search
CPC .......... H01L 29/1606; H01L 21/02568; H01L 21/0262; H01L 21/02444; H01L 21/02485;
(Continued)

(56) References Cited

U.S. PATENT DOCUMENTS 7,667,271 B2  2/2010  Yu et al.
7,910,453 B2  3/2011  Xu et al.
(Continued)

FOREIGN PATENT DOCUMENTS

CN  103219403 A  7/2013

OTHER PUBLICATIONS

"Two-dimensional gallium nitride realized via graphene encapsulation" by Zakaria Y. Al Balushi et al. in Nature Materials Lettes 15, 1166-1171 (2016).
(Continued)

*Primary Examiner* — Eric A. Ward
(74) *Attorney, Agent, or Firm* — Slater Matsil, LLP

(57) ABSTRACT

Semiconductor devices comprising two-dimensional (2D) materials and methods of manufacture thereof are described. In an embodiment, a method for manufacturing a semiconductor device comprising 2D materials may include: epitaxially forming a first 2D material layer on a substrate; and epitaxially forming a second 2D material layer over the first 2D material layer, the first 2D material layer and the second 2D material layer differing in composition.

20 Claims, 9 Drawing Sheets

(51) Int. Cl.
  H01L 29/267 (2006.01)
  H01L 29/66 (2006.01)
  H01L 29/778 (2006.01)
  C01B 32/186 (2017.01)
  H01L 29/16 (2006.01)
  H01L 29/24 (2006.01)
(52) U.S. Cl.
  CPC .. H01L 21/02444 (2013.01); H01L 21/02485 (2013.01); H01L 21/02499 (2013.01); H01L 29/267 (2013.01); H01L 29/66045 (2013.01); H01L 29/778 (2013.01); *C01B 32/186* (2017.08); *H01L 29/1606* (2013.01); *H01L 29/24* (2013.01)
(58) Field of Classification Search
  CPC ......... H01L 21/02499; H01L 21/02527; H01L 21/0259; H01L 29/24; H01L 29/267; H01L 29/66045; H01L 29/778; H01L 31/0336; H01L 31/1129; H01L 31/18; C01B 31/0453
  See application file for complete search history.

(56) References Cited

U.S. PATENT DOCUMENTS

| | | | |
|---|---|---|---|
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 2012/0112164 | A1 | 5/2012 | Chu |
| 2013/0130011 | A1 | 5/2013 | Hong et al. |
| 2014/0001574 | A1 | 1/2014 | Chen et al. |
| 2014/0110755 | A1 | 4/2014 | Colinge |
| 2014/0120270 | A1* | 5/2014 | Tour .............. C23C 16/26 427/596 |
| 2014/0151812 | A1 | 6/2014 | Liaw |
| 2014/0234200 | A1 | 8/2014 | Tour et al. |
| 2014/0299839 | A1 | 10/2014 | Shepard et al. |
| 2015/0110998 | A1 | 4/2015 | Borrelli et al. |
| 2015/0232343 | A1 | 8/2015 | Liu et al. |
| 2016/0020280 | A1* | 1/2016 | Heo .............. H01L 33/26 257/27 |
| 2016/0093491 | A1* | 3/2016 | Choi .............. H01L 21/02485 438/151 |

OTHER PUBLICATIONS

Araki, T et al., "Radio-frequency plasma-excited molecular beam epitaxy growth of GaN on graphene/Si(100) substrates," Applied Physics Express, 7, 071001, http://dx.doi.org/10.7567/APEX.7.071001, Jun. 2014, 4 pages.

Britnell et al., "Field-Effect Tunneling Transistor Based on Vertical Graphene Heterostructures", Science Mag, vol. 335, Feb. 24, 2012, 16 pages.

Fanton, et al., "Characterization of Graphene Films and Transistors Grown on Sapphire by Metal-Free Chemical Vapor Deposition," ACS NANO vol. 5, No. 10, 2011.

Georgiou et al. "Vertical field-effect transistor based on graphene-WS2 heterostructures for flexible and transparent electronics", Letters, Nature Nanotechnology, Dec. 23, 2013, 12 pages.

Hwang, J., et al., "Epitaxial growth of graphitic carbon on C-face SiC and sapphire by chemical vapor deposition (CVD)," Journal of Crystal Growth 312 (2010), pp. 3219-3224.

Ling et al. "Role of the Seeding Promoter in MoS2 Growth by Chemical Vapor Deposition", Nano Letters, Jan. 29, 2014, 24 pages.

Medina, H., et al., "Metal-Free Growth of Nanographene on Silicon Oxides for Transparent Conducting Applicatoins," Adv. Funct. Mater. 2012, 22, pp. 2123-2128.

Miyasaka, Y. et al., "Graphite Thin Films Consisting of Nanograins of Multilayer Graphene on Sapphire Substrates Directly Grown by Alcohol Chemical Vapor Deposition," Japanese Journal of Applied Physics 50 (2011).

Shi et al., "van der Waals Epitaxy of MoS2 Layers Using Graphene as Growth Templates", Nano Letters, May 29, 2012, 15 pages.

Shih et al. "Tuning On-Off Current Ratio and Field-Effect Mobility in a MoS2-Graphene Heterostructure via Schottky Barrier Modulation", ACS Nano, vol. 8, No. 6, May 13, 2014, 17 pages.

Son, M., et al., "Direct growth of graphene pad on exfoliated hexagonal boron nitride surface," Nanoscale, 2011, 3, 3089.

Song, H et al., "Large scale metal-free synthesis of graphene on sapphire and transfer-free device fabrication," Nanoscale, www.rcs.orginanoscale, 4, 3050, Mar. 2012, 5 pages.

Ugeda et al., "Giant bandgap renormalization and excitonic effects in a monolayer transition metal dichalcogenide semiconductor", Nature Materials, vol. 13, Aug. 31, 2014, 29 pages.

Yu et al., "Highly efficient gate-tunable photocurrent generation in vertical heterostructures of layered materials", Nature Nanotechnology, vol. 8, Dec. 2013, 12 pages.

Yu, Y et al., "Controlled Scalable Synthesis of Uniform, High-Quality Monolayer and Few-layer MoS2 Films," Scientific Reports, 3:1866, May 2013, 6 pages.

Zhang, W et al., "Ultrahigh-Gain Photodetectors Based on Atomically Thin Graphene-MoS2 Heterostructures," Scientific Reports, 4:3826, Jan. 2014; 8 pages.

* cited by examiner

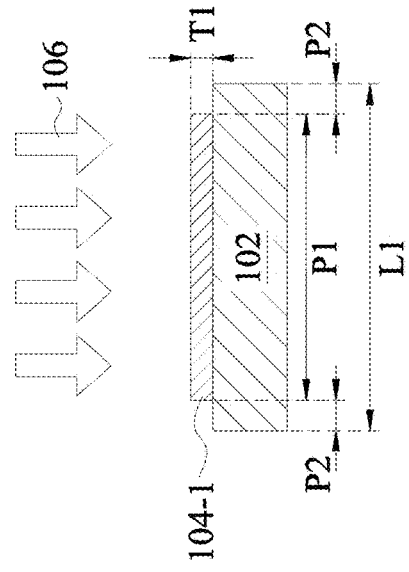
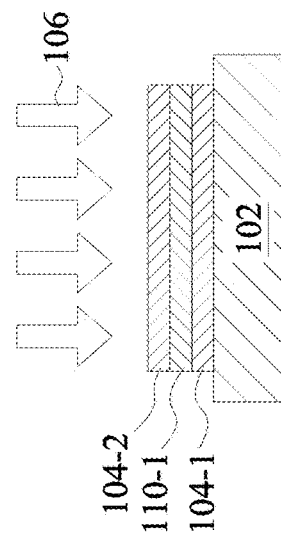
Fig.6A
Fig.6B
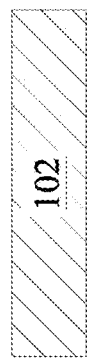
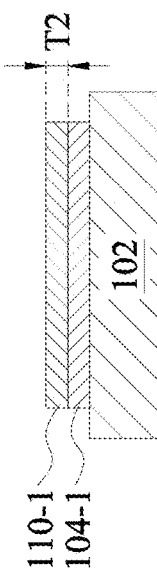
Fig.6C
Fig.6D

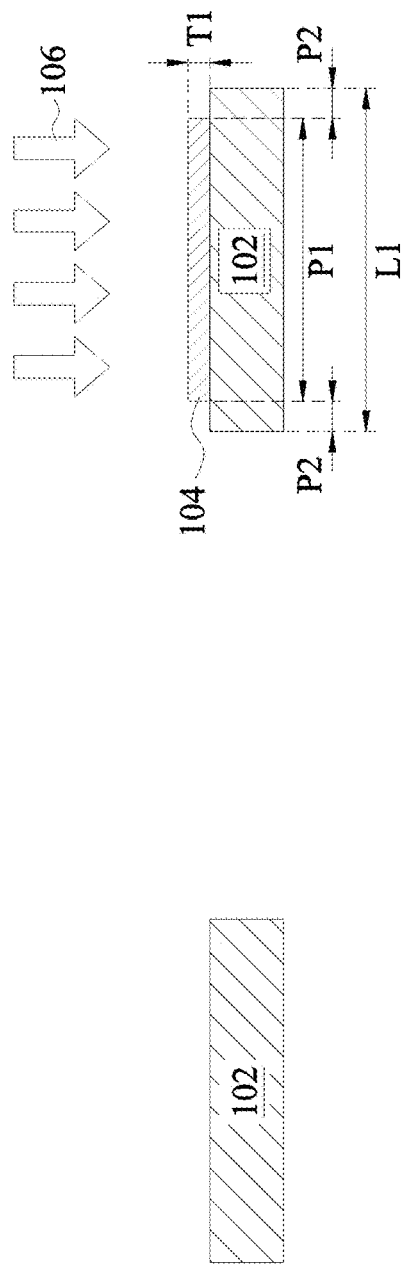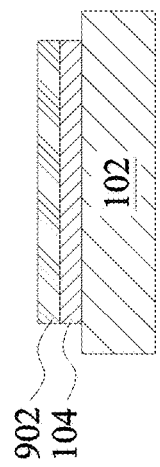

SEMICONDUCTOR DEVICES COMPRISING 2D-MATERIALS AND METHODS OF MANUFACTURE THEREOF

CROSS-REFERENCE TO RELATED APPLICATIONS

This application is a divisional of U.S. application Ser. No. 14/621,635, filed on Feb. 13, 2015, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The circuit components or elements of a semiconductor device can include transistors, capacitors, inductors, resistors, diodes, conductive lines, or other elements, depending on the circuit design. A field effect transistor (FET) is one type of transistor.

In a recent development of the FET, a channel region of the FET may be formed in a two dimensional (2D) material layer, which may provide the FET with improved performance (e.g. relative to FETs that are devoid of a 2D material layer). For example, photo-transistors having a channel layer formed in a 2D material layer exhibit high sensitivity to light compared to photo-transistors that have a channel layer formed in a typical semiconductor material, such as silicon, germanium, combinations thereof, or the like. Improved methods of forming 2D material layers for semiconductor devices may be needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A to 6D show a process flow illustrating various intermediary stages of manufacturing a semiconductor device having a hetero-structure comprising a first TMD-containing layer sandwiched between a first carbon-containing layer and a second carbon-containing layer, in accordance with some embodiments.

FIGS. 9A to 9C show a process flow illustrating various intermediary stages of forming a III-V semiconductor layer over a graphene film, in accordance with some embodiments.

DETAILED DESCRIPTION OF ILLUSTRATIVE EMBODIMENTS

Figure 1A:
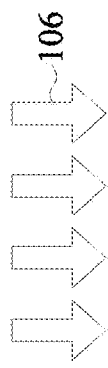
FIGS. 1A to 1I show a process flow illustrating various intermediary stages of manufacturing a semiconductor device, in accordance with some embodiments.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 1I show a process flow illustrating various intermediary stages of manufacturing a semiconductor device, in accordance with one or more embodiments. The semiconductor device manufactured using the process flow illustrated in FIGS. 1A to 1I may, as an example, comprise one or more two dimensional (2D) material layers. Illustratively, a transistor (e.g. a field effect transistor) having one or more 2D material layers may be manufactured using the process flow shown in FIGS. 1A to 1I.

FIG. 1A shows a carrier substrate 102, which may function to provide mechanical and/or structure support for features or structures that are formed in the subsequent steps of the process flow illustrated in FIGS. 1B to 1I. These features or structures may be parts or portions of a semiconductor device (e.g. a transistor) that may be formed on or over the carrier substrate 102. The carrier substrate 102 may be a semiconductor substrate. For example, the carrier substrate 102 may comprise sapphire (e.g. crystalline $Al_2O_3$), e.g. a large grain or a single crystalline layer of sapphire or a coating of sapphire. As another example, the carrier substrate 102 may be a sapphire substrate, e.g. a transparent sapphire substrate comprising, as an example, $\alpha$-$Al_2O_3$.

Figure 1B:
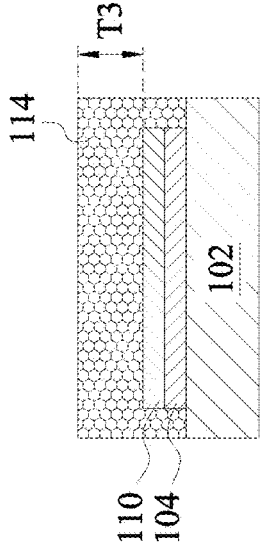

FIG. 1B shows a first conductive layer 104 formed over the carrier substrate 102, e.g. using a first deposition process 106. The first conductive layer 104 may be formed directly on the carrier substrate 102 such that the first conductive layer 104 and the carrier substrate 102 are in contact (e.g. physical contact) with each other. In the example of FIG. 1B, the first conductive layer 104 is formed over a first portion P1 of the carrier substrate 102, while a second portion P2 of the carrier substrate 102 is free from the first conductive layer 104. In an embodiment, the first portion P1 may be at least about 60 percent of an entire lateral extent L1 of the carrier substrate 102, e.g. in a range from about 60 percent to about 98 percent, e.g. in a range from about 70 percent to about 90 percent. However, in another example, the first conductive layer 104 may be formed to cover substantially the entire lateral extent L1 of the carrier substrate 102 (e.g. greater than or equal to about 98 percent of the entire lateral extent L1 of the carrier substrate 102).

The first conductive layer 104 may be a first 2D material layer comprising one or more sub-layers (e.g. less than or equal to three sub-layers). Each of these sub-layers comprises a single layer of atoms or molecules. Consequently, the first 2D material layer may be a three-molecule thick layer, a two-molecule thick layer, or a one-molecule thick layer. The first conductive layer 104 may comprise carbon. As an example, the first conductive layer 104 may comprise one or more layers of graphene. In such an embodiment, the first conductive layer 104 may be a single-layer graphene film (e.g. a one molecule thick graphene layer) or a bi-layer graphene film (e.g. a two molecule thick graphene layer). In another example, the first conductive layer 104 may a three or more layer graphene film. The first conductive layer 104 may have a first thickness T1 in a range from about 0.2 nm to about 1 nm, e.g. in a range from about 0.3 nm to about 0.8 nm. In an embodiment where the first conductive layer 104 is a single-layer graphene film, the first thickness T1 may be in a range from about 0.33 nm to about 0.37 nm (e.g. about 0.35 nm). In another embodiment where the first conductive layer 104 is a bi-layer graphene film, the first thickness T1 may be in a range from about 0.65 nm to about 1 nm (e.g. about 0.8 nm).

In a typical chemical vapor deposition (CVD) process, a metal substrate (such as Cu or Ni) may be used as a catalyst (e.g. for methane ($CH_4$) decomposition) and the first conductive layer 104 may be initially formed on the metal substrate by the typical CVD process. Thereafter, the first conductive layer 104 may be removed from the metal substrate and transferred and subsequently reattached to an electronic device-compatible substrate (e.g. the carrier substrate 102).

The first deposition process 106 may be a first epitaxial CVD process. However, the first deposition process 106 shown in FIG. 1B differs from the above-described typical CVD process in that the first deposition process 106 is a metal catalyst-free CVD process that directly grows (e.g. epitaxially) the first conductive layer 104 on an electronic device-compatible substrate (e.g. the carrier substrate 102). The first deposition process 106 may be carried out while the carrier substrate 102 is disposed in a reaction chamber (not shown in FIG. 1B).

In an embodiment, the first deposition process 106 may be conducted at a temperature less than or equal to about 1000 degrees Celsius, e.g. in a range from about 750 degrees Celsius to about 1000 degrees Celsius, e.g. about 950 degrees Celsius. This range of temperatures may, as an example, be in a range of temperatures typically used in semiconductor processing. Consequently, the first deposition process 106 shown in FIG. 1B may be easily integrated with existing semiconductor processing steps and easily implemented with existing semiconductor processing equipment.

The first deposition process 106 may include flowing a hydrogen-containing fluid (e.g. a hydrogen-containing gas, such as $H_2$ gas) into the reaction chamber at a flow rate in a range from about 30 standard cubic centimeters per minute (sccm) to about 80 sccm (e.g. about 50 sccm), although other flow rates may be possible as well. The hydrogen-containing fluid may, as an example, function as a reducing agent in the first deposition process 106.

As described above, the first conductive layer 104 may comprise carbon. Accordingly, the first deposition process 106 may also include flowing a carbon-containing fluid (e.g. a carbon-containing gas, e.g. $CH_4$ gas) into the reaction chamber at a flow rate in a range from about 10 sccm to about 50 sccm (e.g. about 30 sccm), although other flow rates may be possible as well. The carbon-containing fluid may, as an example, function as a carbon source for the first conductive layer 104.

The hydrogen-containing fluid and the carbon-containing fluid may react in the reaction chamber at an elevated temperature (e.g. about 950 degrees Celsius) to produce a carbon-containing species (e.g. graphene) that may subsequently precipitate onto the support substrate 102 to yield the carbon-containing first conductive layer 107.

The first deposition process 106 may be conducted for a duration of time ranging from about 60 minutes to about 150 minutes (e.g. about 120 minutes), although other time durations may be possible as well. The duration of the first deposition process 106 may depend on the flow rates of the hydrogen-containing fluid and the carbon-containing fluid as well as on the temperature at which the first deposition process 106 is conducted at. The duration of the first deposition process 106 may also depend on the desired first thickness T1 of the first conductive layer 104.

Figure 2A:
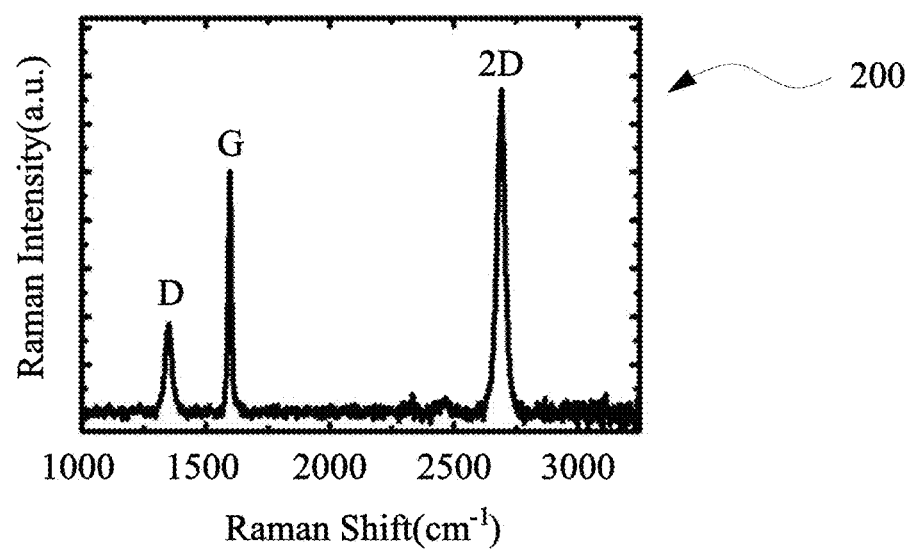
FIGS. 2A and 2B show a Raman spectrum and a high-resolution transmission electron microscopy (HRTEM) image of a carbon-containing 2D material layer, in accordance with some embodiments.

FIG. 2A shows a Raman spectrum 200 of the first conductive layer 104 formed on the carrier substrate 102 in an embodiment where the first conductive layer 104 comprises graphene. The Raman spectrum 200 shown in FIG. 2A may, as an example, be obtained by performing Raman spectroscopy on the first conductive layer 104 after the first deposition process 106 is conducted for about 120 minutes. As shown in FIG. 2A, the existence of graphene in the first conductive layer 104 is confirmed by a first characteristic peak G and a second characteristic peak 2D for graphene. In the Raman spectrum 200 shown in FIG. 2A, the first characteristic peak G is located in a range from about 1580 $cm^{-1}$ to about 1620 $cm^{-1}$ (e.g. about 1605 $cm^{-1}$), while the characteristic second characteristic peak 2D is located in a range from about 2650 $cm^{-1}$ to about 2750 $cm^{-1}$ (e.g. about 2691 $cm^{-1}$). As shown in FIG. 2A, a third characteristic peak D may also present in the Raman spectrum 200. The third characteristic peak D may be located in a range from about 1250 $cm^{-1}$ to about 1450 $cm^{-1}$ (e.g. about 1350 $cm^{-1}$). It is noted that the positions of the first characteristic peak G, the second characteristic peak 2D, and the third characteristic peak D for graphene can vary slightly within the above-mentioned ranges depending on the process parameters of the first deposition process 106, such as flow rates of the hydrogen-containing fluid and the carbon-containing fluid, the temperature at which the first deposition process 106 is conducted at, and the duration of the first deposition process 106.

As shown in the Raman spectrum 200, the intensities of the first characteristic peak G and the second characteristic peak 2D are greater than an intensity of the third characteristic peak D, thereby indicating that the first conductive layer 104 comprises a graphene film with superior crystalline quality. Furthermore, the relative intensities of the second characteristic peak 2D and the third characteristic peak D suggest that the first conductive layer 104 is a bi-layer graphene film (e.g. a two molecule thick graphene layer).

The Raman spectrum 200 shown in FIG. 2A may be obtained by performing Raman spectroscopy over a portion of the first conductive layer 104. However, other Raman spectrums may be obtained by performing Raman spectroscopy over other portions of the first conductive layer 104. A ratio of the intensities of the second characteristic peak 2D and the first characteristic peak G for the Raman spectrum 200 may be calculated from the intensities shown in FIG. 2A. Furthermore, ratios of the intensities of the second characteristic peak 2D and the first characteristic peak G may be calculated from the other Raman spectrums obtained from other portions of the first conductive layer 104. It is observed that a distribution of the ratios of the intensities of the second characteristic peak 2D and the first characteristic peak G may be in a range from about 1.0 to about 1.5 (e.g. about 1.3), thereby indicating that the first conductive layer 104 is a uniform bi-layer graphene film formed on the support substrate 102. In other words, a thickness of the first conductive layer 104 is uniform over the support substrate 102.

Figure 2B:
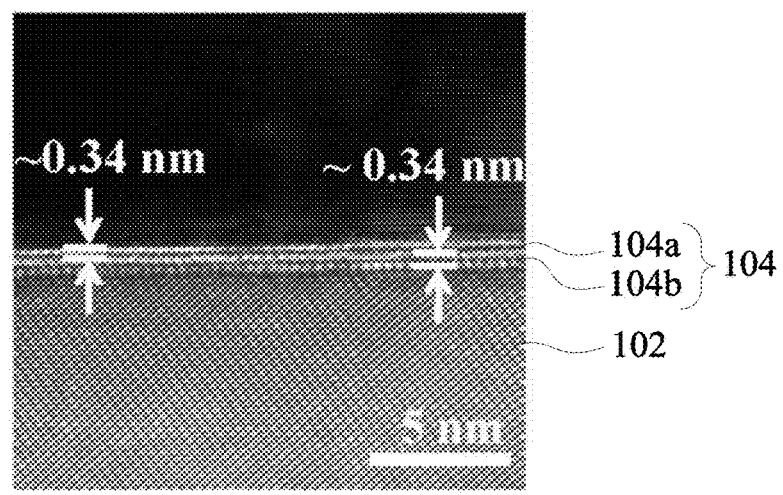

FIG. 2B shows a high-resolution transmission electron microscopy (HRTEM) image of a cross-section of a portion of the first conductive layer 104 and the support substrate 102. As shown in FIG. 2B, the first conductive layer 104 may be a bi-layer graphene film comprising a first graphene film 104a and a second graphene film 104b. The HRTEM image shown in FIG. 2B thereby confirms the observations gleaned from the Raman spectrum 200 shown in FIG. 2A. As shown in FIG. 2B, a thickness of the first graphene film 104a may be about 0.34 nm, which is the approximate thickness of a one molecule thick graphene layer. Similarly, a thickness of the second graphene film 104b may be about 0.34 nm, thereby indicating that the second graphene film 104b is also a one molecule thick graphene layer.

Figure 1C:
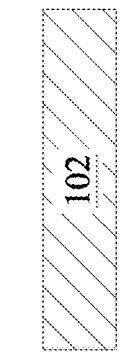

Referring to FIG. 1C, the process flow continues with the formation of a second conductive layer 110 over the first conductive layer 104, e.g. using a second deposition process 112. The second conductive layer 110 may be formed directly on the first conductive layer 104 such that the first conductive layer 104 and the second conductive layer 110 are in contact (e.g. physical contact) with each other. In the example of FIG. 1C, the first conductive layer 104 is formed over the entire extent of the first conductive layer 104. However, in other embodiments, a portion of the first conductive layer 104 may be free from the second conductive layer 110.

The second conductive layer 110 may be a second 2D material layer that is different from the first 2D material layer of the first conductive layer 104. The second 2D material layer of the second conductive layer 110 may comprise one or more sub-layers (e.g. less than or equal to three sub-layers). Each of these sub-layers comprises a single layer of atoms or molecules. Consequently, the second 2D material layer may be a three-molecule thick layer, a two-molecule thick layer, or a one-molecule thick layer. As an example, the second conductive layer 110 may comprise one or more transition metal dichalcogenide (TMD) material layers. A TMD material may comprise a compound of a transition metal and a group VIA element. The transition metal may include tungsten (W), molybdenum (Mo), Ti, or the like, while the group VIA element may comprise sulfur (S), selenium (Se), tellurium (Te), or the like. For example, the second conductive layer 110 may comprise $MoS_2$, $MoSe_2$, $WS_2$, $WSe_2$, combinations thereof, or the like.

Figure 3:
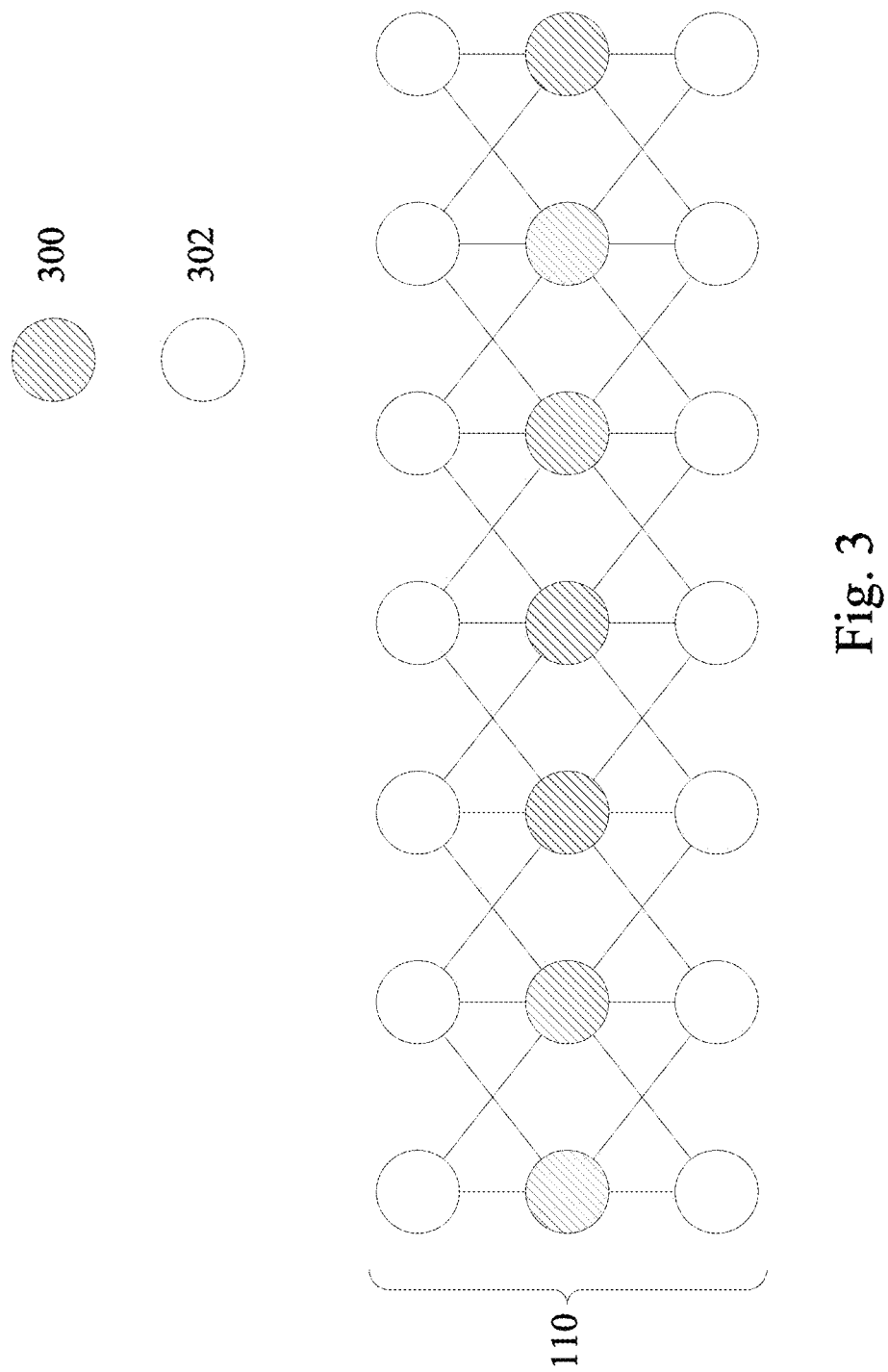
FIG. 3 shows a schematic representation of a one molecule thick transition metal dichalcogenide (TMD) layer, in accordance with some embodiments.

As described above, the second conductive layer 110 may comprise a TMD material layer comprising one or more sub-layers. FIG. 3 illustrates the second conductive layer 110 comprising a one molecule thick TMD material layer in accordance with some exemplary embodiments. In FIG. 3, the transition metal atoms 300 form a layer in the middle, and the group VIA atoms 300 forms a first layer over the layer of transition metal atoms 300, and a second layer underlying the layer of transition metal atoms 300. The transition metal atoms 300 may be W atoms, Mo atoms, or T1 atoms, while the group VIA atoms 302 may be S atoms, Se atoms, or Te atoms. In the example of FIG. 3, each of the transition metal atoms 300 is bonded to four group VIA atoms 302, and each of the group VIA atoms 302 is bonded to two transition metal atoms 300.

The second conductive layer 110 may have a second thickness T2 in a range from about 0.5 nm to about 1.6 nm. In an embodiment where the second conductive layer 110 is a single-layer TMD material layer (a one molecule thick TMD material layer), the second thickness T2 may be in a range from about 0.5 nm to about 0.75 nm (e.g. about 0.65 nm). In another embodiment where the second conductive layer 110 is a bi-layer TMD material layer (a two molecule thick TMD material layer), the second thickness T2 may be in a range from about 0.6 nm to about 1.6 nm (e.g. about 1.4 nm).

The second deposition process 112 may be a second epitaxial CVD process that directly grows (e.g. epitaxially) the second conductive layer 110 on the first conductive layer 104. The second deposition process 112 may be carried out while the carrier substrate 102 is disposed in a reaction chamber (not shown in FIG. 1C).

In an embodiment, the second deposition process 112 may be conducted at a temperature less than or equal to about 1000 degrees Celsius, e.g. in a range from about 750 degrees Celsius to about 1000 degrees Celsius or in a range from about 600 degrees Celsius to about 700 degrees Celsius. These ranges of temperatures may, as an example, be in a range of temperatures typically used in semiconductor processing. Consequently, the second deposition process 112 shown in FIG. 1C may be easily integrated with existing semiconductor processing steps and easily implemented with existing semiconductor processing equipment.

The second deposition process 112 may include flowing a carrier gas, such as $N_2$ gas, and one or more process gases into the reaction chamber. As an example, in an embodiment where the second conductive layer 110 comprises $MoS_2$, the process gas comprises precursor materials such as $MoCl_2$ and sulfur. This process gas is introduced into the reaction chamber together with $N_2$ carrier gas. The precursor materials of the process gas may then react at an elevated temperature (e.g. in a range from about 800 degrees Celsius to about 900 degrees Celsius) to produce an $MoS_2$ species that may subsequently precipitate onto the first conductive layer 104 to yield the second conductive layer 110 comprising $MoS_2$. In another example, the process gas comprises precursor materials such as $MoO_3$ and sulfur. This process gas is introduced into the reaction chamber together with $N_2$ carrier gas. The precursor materials of the process gas may then react at an elevated temperature (e.g. in a range from about 600 degrees Celsius to about 700 degrees Celsius) to produce an $MoS_2$ species that may subsequently precipitate onto the first conductive layer 104 to yield the second conductive layer 110 comprising $MoS_2$.

As described above, the second 2D material layer of the second conductive layer 110 may comprise one or more sub-layers. The number of sub-layers resulting from the second deposition process 112 can be controlled by varying the amount of precursors introduced into the reaction chamber as well as the pressure and/or temperature under which the second deposition process 112 is performed.

Figure 4A:
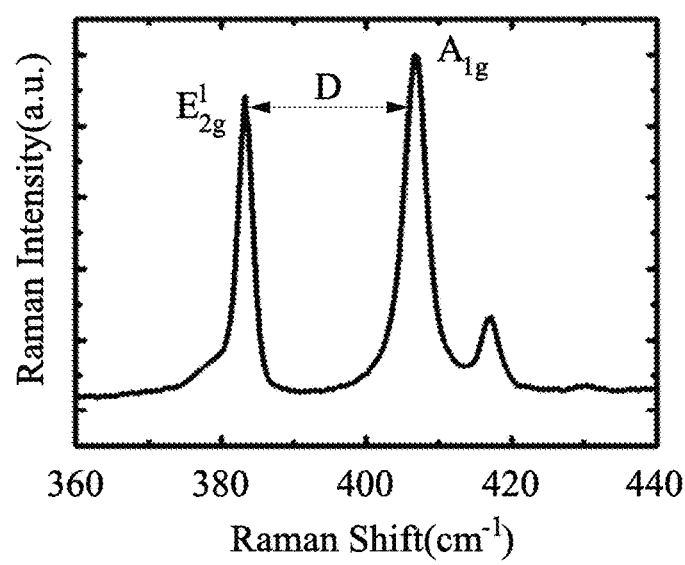
FIGS. 4A and 4B show a Raman spectrum and an HRTEM image of a TMD-containing 2D material layer, in accordance with some embodiments.

FIG. 4A shows a Raman spectrum 400 of the second conductive layer 110 formed on the first conductive layer 104. The Raman spectrum 400 shown in FIG. 4A may, as an example, be obtained by performing Raman spectroscopy on the second conductive layer 110 after the second deposition process 112 is conducted. As shown in FIG. 4A, the Raman spectrum 400 of the second conductive layer 110 (e.g. comprising an $MoS_2$ film) shows significant $E^1_{2g}$ and $A_{1g}$ peaks with $E^1_{2g}$ peak full width at half maximum (FWHM) being in a range from about 2.5 $cm^{-1}$ and about 3 $cm^{-1}$, e.g. about 2.81 $cm^{-1}$, which indicates that good crystalline quality can be obtained using the second deposition process 112. As shown in FIG. 4A, the $E^1_{2g}$ and $A_{1g}$ peaks are spaced apart from each other by a separation D, which is in a range from about 20 $cm^{-1}$ to about 25 $cm^{-1}$ (e.g. about 23.3 $cm^{-1}$). This suggests that a bi-layer $MoS_2$ film (e.g. a two molecule thick $MoS_2$ layer) can be obtained under some conditions.

Figure 4B:
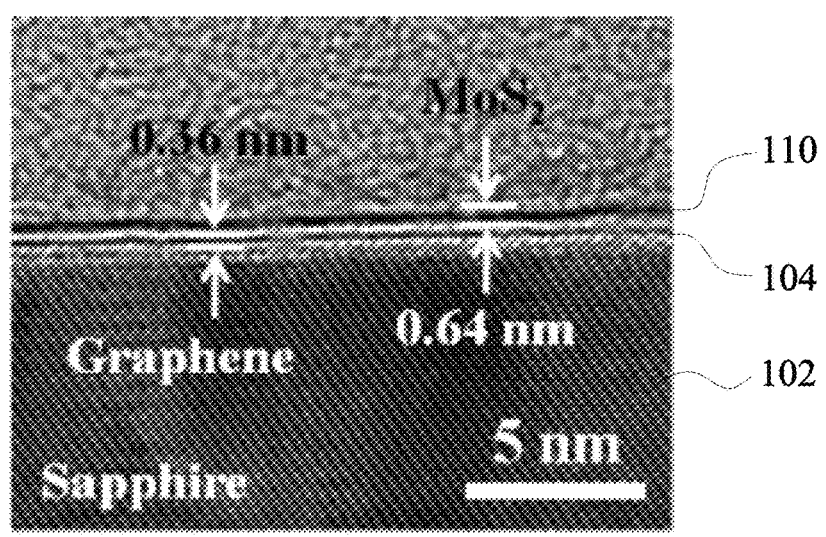

FIG. 4B shows an HRTEM image of a cross-section of a portion of the second conductive layer 110, the first conductive layer 104, and the support substrate 102 in an embodiment where the first conductive layer 104 is a single-layer graphene film and the second conductive layer 110 is a single-layer $MoS_2$ film. As shown in FIG. 4B, the first conductive layer 104 is formed directly on the carrier substrate 102, while the second conductive layer 110 is formed directly on the first conductive layer 104. As mentioned above, the HRTEM image shown in FIG. 4B relates to an embodiment where the first conductive layer 104 is a single-layer graphene film and the second conductive layer 110 is a single-layer $MoS_2$ film. Consequently, measurements of the HRTEM image of FIG. 4B show that the first conductive layer 104 has the first thickness T1 of about 0.36 nm, while the second conductive layer 110 has the second thickness T2 of about 0.64 nm.

Figure 5:
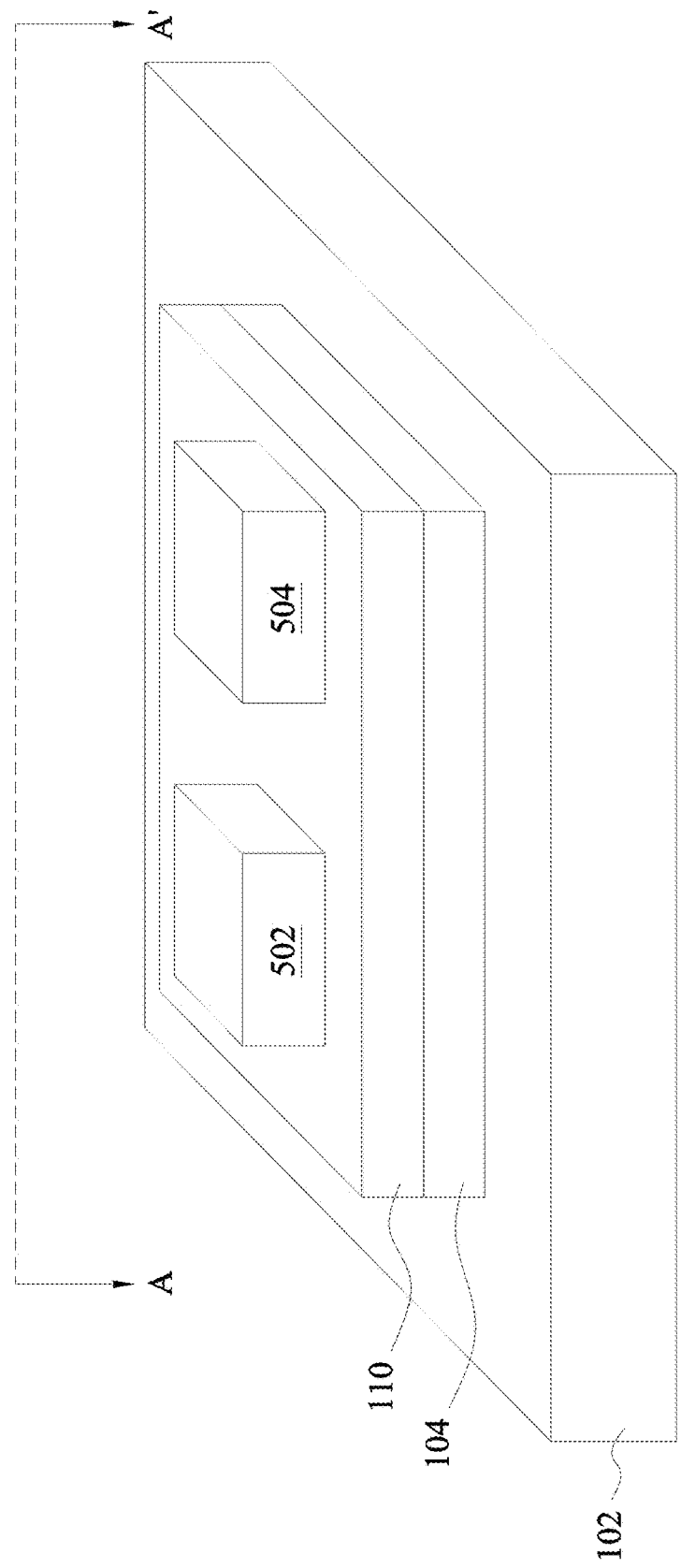
FIG. 5 shows a perspective view of a source contact and a drain contact formed over a hetero-structure and a carrier substrate, in accordance with some embodiments.

In an embodiment, a channel layer of a transistor (e.g. an FET) may be formed in the 2D material layers of the first conductive layer 104 and the second conductive layer 110, e.g. under the influence of voltages applied to the first conductive layer 104 and the second conductive layer 110. In the process flow steps that follow, a source contact and a drain contact may be formed over the second conductive layer 110. A perspective view of a result of these process flow steps is shown in FIG. 5, where a source contact 502 and a drain contact 504 are laterally separated from each other and formed over the second conductive layer 110.

Figure 1D:
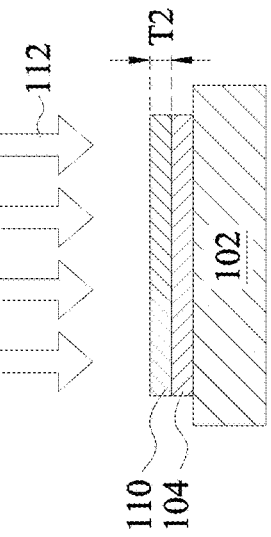
Figure 1F:
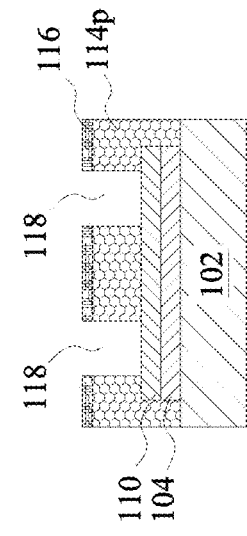

Referring to FIG. 1D, a mask 114 may initially be formed over the second conductive layer 110. The mask 114 may completely cover sidewalls and a top surface the second conductive layer 110, as shown in FIG. 1D. The mask 114 may also cover sidewalls of the first conductive layer 104. The mask 114 may be formed using a suitable process such as chemical vapor deposition, plasma enhanced chemical vapor deposition, atomic layer deposition, or the like. However, other suitable methods of forming the mask 114 may be utilized. In an embodiment, the mask 114 comprises a dielectric material such as silicon nitride, titanium nitride, silicon oxynitride, combinations thereof, or the like. However, it should be understood that the mask 114 may comprise other suitable materials. The mask 114 may be formed such that the portion of the mask 114 disposed over the top surface of the second conductive layer 110 has a third thickness T3 between about 200 nm and about 300 nm, such as about 100 nm.

Figure 1I:
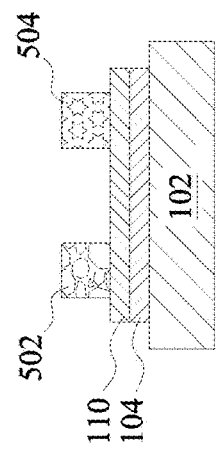

Once the mask 114 has been formed, portions of the mask 114 may be removed in order to expose regions of the second conductive layer 110 over which the source contact 502 and the drain contact 504 are to be formed. In other words, the mask 114 may be patterned to expose regions of the second conductive layer 110. As shown in the example of FIG. 1E, the mask 114 may be patterned by initially forming a patterned photoresist 116 over the mask 114. The patterned photoresist 116 may be formed by depositing a photosensitive material over the mask 114 and subsequently patterning the photosensitive material to yield the patterned photoresist 116. The photosensitive material may be deposited over the mask 114 using spin-on coating, chemical vapor deposition, plasma enhanced chemical vapor deposition, atomic layer deposition, or the like. The photosensitive material may be patterned using, for example, a lithographic process (e.g. a photo-lithographic process).

Following the formation of the patterned photoresist 116, the mask 114 may be patterned using the patterned photoresist 116 as a mask. The result of this processing step is a patterned mask 114p, shown in FIG. 1F, having openings 118 therein. The openings 118 may define the boundaries (e.g. the sidewalls) of the source contact 502 and the drain contact 504 that are subsequently formed. In an embodiment, an etching process (e.g. a reactive ion etching process) may be used to pattern the mask 114. However, other suitable processes for patterning the mask 114 may also be used. The patterning of the mask 114 may continue until portions of the second conductive layer 110 are exposed.

Figure 1G:
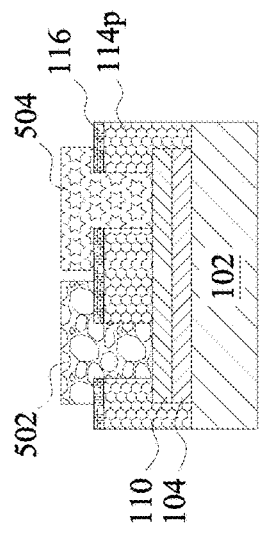
Figure 1E:
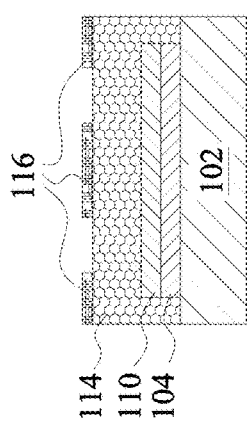

Referring to FIG. 1G, the openings 118 may be filled with a conductive material to form the source contact 502 and the drain contact 504. The conductive material of the source contact 502 and the drain contact 504 may comprise copper, Pd, silver (Ag), Ni, gold (Au), Ti, gadolinium (Gd), alloys thereof, or the like, and may be formed by a deposition process. The deposition process may be continued at least until the openings 118 have been filled with the conductive material of the source contact 502 and the drain contact 504. Additionally, to ensure a complete filling of the openings 118, the deposition process may be continued to overfill the openings 118, as shown in the example of FIG. 1G. Such an overfilling can result in portions of the source contact 502 and the drain contact 504 extending laterally such that an extension of the source contact 502 and the drain contact 504 partially extends over a portion of the patterned photoresist 116.

Figure 1H:
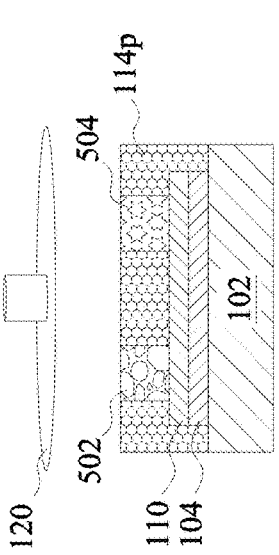

FIG. 1H illustrates a planarization process 120, which may be utilized to planarize the source contact 502 and the drain contact 504 and to expose the surface of the patterned mask 114p. In so doing, top surfaces of the source contact 502 and the drain contact 504 may be substantially co-planar with a top surface of the patterned mask 114p. The planarization process 120 may be a chemical mechanical polish (CMP) or an etch back process, or any other suitable process for planarizing the source contact 502 and the drain contact 504.

Thereafter, as shown in FIG. 1I, the patterned mask 114p may be removed. This may be achieved by a stripping process (e.g. a wet strip process) or an ashing process (e.g. plasma ashing process) that leaves the source contact 502 and the drain contact 504 substantially unperturbed. After this, the process flow may be continued to form a gate structure (e.g. a back-gate structure or a front-gate structure, not shown in the Figures). In the embodiment where a back-gate structure is formed, a gate stack comprising a gate electrode and a gate dielectric may be formed on the side of the carrier substrate 102 facing away from the first conductive layer 104 and the second conductive layer 110. In another embodiment where a front-gate structure is formed, a gate stack comprising a gate electrode and a gate dielectric may be formed on the side of the carrier substrate 102 having the first conductive layer 104 and the second conductive layer 110 formed thereon.

FIG. 1I may, as an example, be a cross-sectional view of FIG. 5 taken along the line A-A'. A channel may be formed in the first conductive layer 104 and the second conductive layer 110, e.g. in a portion of the first conductive layer 104 and the second conductive layer 110 between the source contact 502 and the drain contact 504, e.g. in response to voltages supplied to the source contact 502 and the drain contact 504.

The combination of the first conductive layer 104 (e.g. comprising carbon) and the second conductive layer 110 (e.g. comprising a TMD material) may be referred to as a hetero-structure. In the process flow shown in FIGS. 1A to 1I, the hetero-structure comprises one first conductive layer 104 and one second conductive layer 110 formed over the one first conductive layer 104. However, in some embodiments, the hetero-structure may comprise more than one first conductive layers 104 and/or more than one second conductive layers 110 that are alternately formed (e.g. by the first deposition process 106 and/or the second deposition process 112). An example of such an embodiment is shown in the process flow illustrated in FIGS. 6A to 6D. The process flow steps shown in FIG. 6A to 6C may be similar to the process flow steps described above in respect of FIGS. 1A to 1C. As shown in FIG. 6B, the first conductive layer 104-1 (referred to in the embodiments of FIGS. 6A to 6D as a first carbon-containing layer 104-1) may be formed over the carrier substrate 102 (e.g. using the first deposition process 106). As shown in FIG. 6C, the second conductive layer 110-1 (referred to in the embodiments of FIGS. 6A to 6D as a first TMD-containing layer 110-1) may be formed over the first carbon-containing layer 104-1 (e.g. using the second deposition process 112).

Following this, a second carbon-containing layer 104-2 may be formed over the first TMD-containing layer 110-1 (e.g. by repeating the first deposition process 106). The second carbon-containing layer 104-2 may comprise similar materials as the first carbon-containing layer 104-1. In some embodiments, this process of alternately forming carbon-containing layers and TMD containing layers may be repeated. For example, in some embodiments, a second TMD-containing layer may be formed over the second carbon-containing layer 104-2 shown in FIG. 6C (e.g. using the second deposition process 112). Once the desired number of carbon-containing layers and TMD-containing layers has been formed, the source contact 502 and the drain contact 504 may be formed over the hetero-structure.

Figure 7:
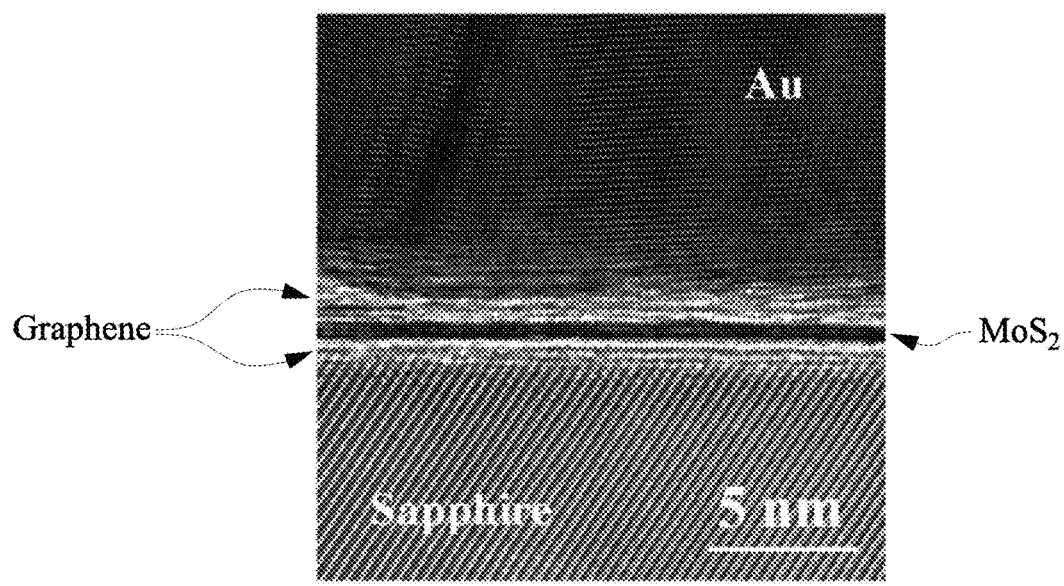
FIG. 7 shows an HRTEM image of the hetero-structure of FIG. 6D, in accordance with some embodiments.

FIG. 7 shows an HRTEM image of a cross-section of a portion of a device where the hetero-structure comprises the first TMD-containing layer 110-1 sandwiched between the first carbon-containing layer 104-1 and the second carbon-containing layer 104-2. In the embodiment shown in FIG. 7, the carrier substrate 102 comprises sapphire, the first TMD-containing layer 110-1 comprises $MoS_2$, while the first carbon-containing layer 104-1 and the second carbon-containing layer 104-2 comprise graphene. Also shown in FIG. 7 is the source contact 502, which comprises Au.

Figure 8:
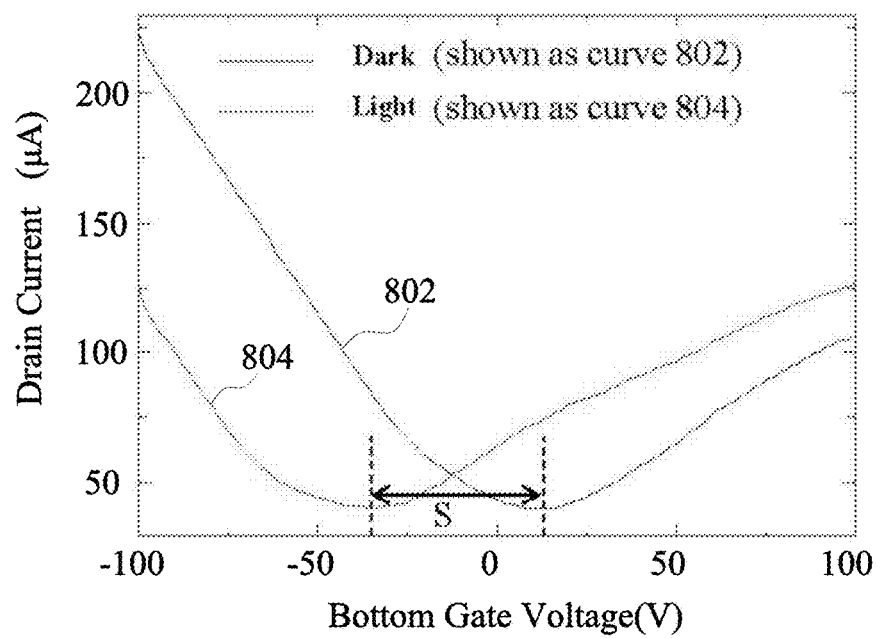
FIG. 8 shows current-voltage characteristics of a device having a hetero-structure including a $MoS_2$/graphene channel layer, in accordance with some embodiments.

In an embodiment, the device manufactured using the process flow shown in FIGS. 6A to 6C may be a back-gated transistor comprising a hetero-structure including a $MoS_2$/graphene channel layer with Au as the source contact 502 and the drain contact 504. FIG. 8 shows $I_D$-$V_{GS}$ characteristics of such a device under dark and illuminated conditions. Hole mobility values of the device may be derived from the $I_D$-$V_{GS}$ curves shown in FIG. 8. As an example, the hole mobility values are about 445 $cm^2V^{-1} S^{-1}$ and 435 $cm^2V^{-1} S^{-1}$ under dark and luminance conditions, respectively. Another phenomenon observed in FIG. 8 is the shift S of $V_{GS}$ with lowest drain currents from about +12 V to about −36 V when light is irradiation onto the device. In this device architecture, since graphene is more conductive than $MoS_2$ and is directly contacted with the Au electrodes, the graphene layer would act as a current path when drain voltages are applied. However, due to its low absorption coefficient, the graphene channel mobility would not change with or without light irradiation. With the intense absorption at 600-700 nm, the $MoS_2$ would absorb light in the wavelength range and generate photo-excited electrons. Since the $MoS_2$/graphene hetero-structure is epitaxially grown in the CVD chamber, there is no chemical contamination on the interfaces. In this case, the photo-excited electrons in the $MoS_2$ layer would effectively hop to the graphene channel and turn the original p-type channel into n-type. The results would be the large lowest-drain-current $V_{GS}$ shift under illumination condition since the observation of lowest drain currents in graphene transistors correspond to the crossover of Fermi levels with the Dirac point.

Among the effects provided by the process flows shown in FIGS. 1A to 1I and FIGS. 6A to 6D is the provision of large-area and uniform 2-D material hetero-structures that can be easily established by epitaxial CVD processes that are easily implemented by and integrated into existing semiconductor processing equipment. The epitaxial CVD processes form the hetero-structure directly over an electronic device-compatible substrate. This, in turn, circumvents the need for sequential exfoliation of 2D material films from another substrate and reattachment of these 2D material films onto the electronic device-compatible substrate. This prevents or substantially reduces chemical contamination and/or physical damage at an interface between the hetero-structure and the carrier substrate 102 and/or an interface between different 2D material layers of the hetero-structure.

FIGS. 9A to 9C show a process flow illustrating various intermediary stages of forming a III-V semiconductor layer over the first conductive layer 104. The process flow steps shown in FIGS. 9A and 9B may be similar to the process flow steps described above in respect of FIGS. 1A and 1B. As shown in FIG. 9C, a III-V semiconductor layer 902 (e.g. comprising GaN) may be formed over the first conductive layer 104 (e.g. comprising graphene). As discussed above, by directly growing one or more graphene films onto an electronic device-compatible substrate, chemical contamination and/or physical damage of the graphene films can be prevented or substantially reduced. Consequently, the surface over which the III-V semiconductor layer 902 is grown may be free structural or crystal defects and may, have significant quality improvement compared to a III-V semiconductor layer 902 grown directly over a silicon substrate.

According to an embodiment presented herein, a method of manufacturing a semiconductor device is provided. The method may include: epitaxially forming a first two-dimensional (2D) material layer on a substrate; and epitaxially forming a second 2D material layer over the first 2D material layer, the first 2D material layer and the second 2D material layer differing in composition.

According to an embodiment presented herein, a method of manufacturing a semiconductor device is provided. The method may include: forming a first carbon-containing layer on a sapphire substrate; forming a first transition metal dichalcogenide (TMD)-containing layer on the first carbon-containing layer; and forming a second carbon-containing layer on the first TMD-containing layer.

According to an embodiment presented herein, a semiconductor device is provided. The semiconductor device may include: a substrate; a hetero-structure comprising 2D material layers disposed on the substrate; and a contact disposed on a portion of the hetero-structure. The hetero-structure may include: a first carbon-containing layer disposed on the substrate; and a first transition metal dichalcogenide (TMD)-containing layer disposed on the first carbon-containing layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a transistor comprising a hetero-structure disposed on the substrate, the hetero-structure comprising:
      a first carbon-containing layer disposed on the substrate; and
      a first transition metal dichalcogenide (TMD)-containing layer disposed on the first carbon-containing layer, wherein a channel of the transistor comprises a first hole mobility value under a first condition of 445 $cm^2 V^{-1} S^{-1}$ and a second hole mobility value under a second condition of 435 $cm^2V^{-1} S^{-1}$; and
   a contact disposed on a portion of the hetero-structure and coupled to the transistor, wherein the first carbon-containing layer has a Raman spectrum with:
      a first peak between 1580 $cm^{-1}$ and 1620 $cm^{-1}$ and having a first intensity,
      a second peak between 2650 $cm^{-1}$ and 2750 $cm^{-1}$ and having a second intensity,
      a third peak between 1250 $cm^{-1}$ and 1450 $cm^{-1}$ and having a third intensity,
      a ratio of the second intensity to the first intensity being in a range of 1 to 1.5, and
      the first intensity being greater than two times the third intensity; and a transistor.

2. The semiconductor device of claim 1, further comprising a second carbon-containing layer disposed on the first TMD-containing layer.

3. The semiconductor device of claim 2, wherein the first carbon-containing layer physically contacts the substrate, and wherein the first TMD-containing layer physically contacts the first carbon-containing layer and the second carbon-containing layer.

4. The semiconductor device of claim 1, wherein the contact is a source contact, the semiconductor device further comprising a drain contact disposed on a second portion of the hetero-structure.

5. The semiconductor device of claim 4, wherein the first carbon-containing layer comprises graphene, the first TMD layer comprises $MoS_2$, and the source contact comprises gold (Au), the drain contact comprises Au.

6. The semiconductor device of claim 1, wherein the first carbon-containing layer comprises a single-layer graphene film or a bi-layer graphene film.

7. The semiconductor device of claim 1, wherein the first TMD-containing layer comprises tungsten (W), molybdenum (Mo), titanium (Ti), sulfur (S), selenium (Se), or tellurium (Te).

8. The semiconductor device of claim 7, wherein the first TMD-containing layer comprises $MoS_2$, $MoSe_2$, $WS_2$, or $WSe_2$.

9. The semiconductor device of claim 1, wherein a thickness of the first carbon-containing layer is in a range of 0.2 nm to 1 nm, and wherein a thickness of the first TMD-containing layer is in a range of 0.5 nm to 1.6 nm.

10. The semiconductor device of claim 1, wherein the substrate comprises sapphire.

11. The semiconductor device of claim 1, wherein the contact comprises copper (Cu), palladium (Pd), silver (Ag), nickel (Ni), gold (Au), titanium (Ti), or gadolinium (Gd).

12. A semiconductor device comprising:
   a substrate;
   a first two-dimensional (2D) material layer disposed on the substrate; and
   a semiconductor layer disposed over the first 2D material layer, wherein the semiconductor layer and the first 2D material layer have different compositions, wherein a portion of the first 2D material layer and a portion of the semiconductor layer collectively provide a channel layer of a transistor, wherein the channel layer of the transistor comprises a first hole mobility value of 445 $cm^2V^{-1} S^{-1}$ under a first condition and a second hole mobility value of 435 $cm^2V^{-1} S^{-1}$ under a second condition, wherein the first condition is less luminous than the second condition, and wherein the first 2D material layer has a Raman spectrum with:
      a first peak between 1580 $cm^{-1}$ and 1620 $cm^{-1}$ and having a first intensity,
      a second peak between 2650 $cm^{-1}$ and 2750 $cm^{-1}$ and having a second intensity,
      a third peak between 1250 $cm^{-1}$ and 1450 $cm^{-1}$ and having a third intensity,
      a ratio of the second intensity to the first intensity being in a range of 1 to 1.5, and
      the first intensity being greater than two times the third intensity.

13. The semiconductor device of claim 12, wherein the semiconductor layer comprises GaN.

14. The semiconductor device of claim 12, wherein the substrate comprises sapphire and wherein the semiconductor layer comprises a 2D material layer.

15. The semiconductor device of claim 12, wherein the first 2D material layer has a uniform thickness over the substrate.

16. A semiconductor device comprising:
   a sapphire substrate;
   a first two-dimensional (2D) material layer disposed on the sapphire substrate; and
   a second two-dimensional (2D) material layer disposed on the first 2D material layer, wherein a channel layer of a transistor is provided by a portion of the first 2D material layer and a portion of the second 2D material layer, wherein the channel layer has a first hole mobility value of 445 cm$^2$V$^{-1}$ S$^{-1}$ under a first condition and a second hole mobility value of 435 cm$^2$V$^{-1}$ S$^{-1}$ under a second condition, wherein the second condition is more luminous than the first condition, and wherein the first 2D material layer has a Raman spectrum with:
- a first peak between 1580 cm$^{-1}$ and 1620 cm$^{-1}$ and having a first intensity,
- a second peak between 2650 cm$^{-1}$ and 2750 cm$^{-1}$ and having a second intensity,
- a third peak between 1250 cm$^{-1}$ and 1450 cm$^{-1}$ and having a third intensity,
- a ratio of the second intensity to the first intensity being in a range of 1 to 1.5, and
- the first intensity being greater than two times the third intensity.

17. The semiconductor device of claim 16, wherein the second 2D material layer comprises a transition metal dichalcogenide (TMD) material.

18. The semiconductor device of claim 16, wherein the first 2D material layer is disposed over at least 60 percent of an entire lateral extent of the sapphire substrate.

19. The semiconductor device of claim 16, wherein the first 2D material layer comprises one or more layers of graphene, wherein each of the one or more layers of graphene is one molecule thick.

20. The semiconductor device of claim 16, wherein the second 2D material layer is a three-molecule thick layer, a two-molecule thick layer, or a one-molecule thick layer.

* * * * *